(12) United States Patent
Theuss et al.

(10) Patent No.: US 8,767,983 B2
(45) Date of Patent: Jul. 1, 2014

(54) MODULE INCLUDING A MICRO-ELECTRO-MECHANICAL MICROPHONE

(75) Inventors: Horst Theuss, Wenzenbach (DE); Jochen Dangelmaier, Beratzhausen (DE); Jens Krause, Rahden (DE); Albert Auburger, Karlstein (DE); Bernd Stadler, Donaustauf (DE)

(73) Assignee: Infineon Technologies AG, Neubiberg (DE)

( * ) Notice: Subject to any disclaimer, the term of this patent is extended or adjusted under 35 U.S.C. 154(b) by 1262 days.

(21) Appl. No.: 11/756,737

(22) Filed: Jun. 1, 2007

(65) Prior Publication Data
US 2008/0298621 A1   Dec. 4, 2008

(51) Int. Cl.
*H04R 25/00* (2006.01)
*B81C 1/00* (2006.01)
*H04R 19/00* (2006.01)
*H04R 1/04* (2006.01)

(52) U.S. Cl.
CPC .... *H04R 19/005* (2013.01); *H01L 2224/48091* (2013.01); *H01R 1/02* (2013.01); *H01L 2224/48137* (2013.01); *B81B 2201/0257* (2013.01); *B81C 1/0023* (2013.01); *H04R 1/04* (2013.01)
USPC .......................................... 381/175; 381/174

(58) Field of Classification Search
USPC ........................................... 381/369; 257/257
See application file for complete search history.

(56) References Cited

U.S. PATENT DOCUMENTS

| | | | |
|---|---|---|---|
| 4,010,335 A * | 3/1977 | Yasuda | 381/91 |
| 4,533,795 A | 8/1985 | Baumhauer, Jr. et al. | |
| 5,303,210 A | 4/1994 | Bernstein | |
| 6,673,697 B2 | 1/2004 | Ma et al. | |
| 2002/0102004 A1* | 8/2002 | Minervini | 381/175 |
| 2005/0189635 A1* | 9/2005 | Humpston et al. | 257/678 |
| 2005/0207605 A1* | 9/2005 | Dehe et al. | 381/369 |
| 2006/0001055 A1* | 1/2006 | Ueno et al. | 257/257 |
| 2006/0097376 A1* | 5/2006 | Leurs et al. | 257/690 |
| 2006/0177083 A1* | 8/2006 | Sjursen et al. | 381/322 |
| 2008/0210463 A1* | 9/2008 | Maas et al. | 174/388 |

FOREIGN PATENT DOCUMENTS

| | | |
|---|---|---|
| DE | 60003199 T2 | 7/2004 |
| DE | 10303263 A1 | 8/2004 |
| DE | 20 2005 017 626 | 2/2006 |
| WO | 2005086532 A2 | 9/2005 |
| WO | 2006/061792 | 6/2006 |

* cited by examiner

*Primary Examiner* — Davetta W Goins
*Assistant Examiner* — Amir Etesam
(74) *Attorney, Agent, or Firm* — Dicke, Billig & Czaja, PLLC

(57) ABSTRACT

A module including a micro-electro-mechanical microphone is disclosed. One embodiment provides a substrate having a trough-shaped depression and a micro-electro-mechanical microphone. The micro-electro-mechanical microphone is mounted into the trough-shaped depression of the substrate.

39 Claims, 11 Drawing Sheets

US 8,767,983 B2

MODULE INCLUDING A MICRO-ELECTRO-MECHANICAL MICROPHONE

BACKGROUND

The invention relates to modules and assemblies and more particularly to modules and assemblies including micro-electro-mechanical microphones.

Modules and assemblies may contain a micro-electro-mechanical microphone. Typically, such a micro-electro-mechanical microphone is mounted in a casing which is built of several components wherein one component of the casing is typically made of a printed circuit board. Micro-electro-mechanical microphones packaged like this are used to transform sound into electrical signals in applications where a miniaturization is of special interest.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Modules and assemblies described in the following include embodiments of a micro-electro-mechanical microphone which dynamically transforms sound e.g., in the audible frequency range into electrical signals in combination with a substrate having a trough-shaped depression. The substrate may be made of plastics which can be manufactured by various molding techniques like compression molding or injection molding, or by machining techniques such as milling. Molding techniques specifically provide for both high design variability and low cost production.

Metal structures which serve as contact elements for electronic components attached to the substrate or establish conduction paths may be generated on the surface of the substrate. Different techniques are available to generate such metal structures integrated to the substrate: A two-component molding with a subsequent galvanic or chemical electroless reinforcement of the conduction paths; a deposition of seed layers, which subsequently are also galvanically or chemically reinforced; or a laser direct structuring.

A hot embossing method can be used to generate the metal structures on the substrates. In this method a form plunger, which carries the mirror-inverted conduction path structure, cuts the needed conduction paths out of a copper foil and presses them on the plastic part to generate a substrate having the desired conducting elements.

Metallized molded substrates made of polymers are known under the technical term "molded interconnect device" (MID). When using in the following description the term "substrate", it may always be understood that this substrate is an MID. Due to their inherent design variability and structured metallization, MIDs are typically able to combine the functionalities of a casing and an electrical contact carrier.

Figure 1:
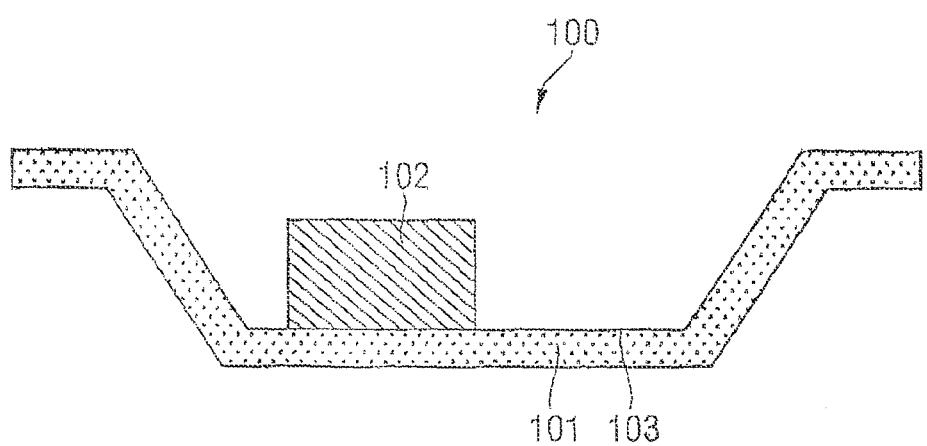
FIG. 1 illustrates a sectional side view of a module according to a first embodiment.

FIG. 1 illustrates an embodiment of a module 100 which includes a substrate 101 and a micro-electro-mechanical microphone 102. The substrate is made of a polymer which may be manufactured by a molding technique as mentioned above. It has a trough-shaped depression 103 and carries in its depression 103 the micro-electro-mechanical microphone 102. The micro-electro-mechanical microphone 102 is a sensor made of e.g., silicon and is able to transform sound into an electrical signal. The micro-electro-mechanical microphone 102 may be situated into the trough-shaped depression 103 of the substrate 101. The micro-electro-mechanical microphone 103 can be mounted in a face-up position or in a face-down position, which is also known as "flip-chip mounted", relative to the trough-shaped depression 103. The micro-electro-mechanical microphone 102 includes a mechanical element that acts upon forces such as acoustical signals and an electronical element like a capacity to generate electrical signals modulated according to the actuation of the mechanical element.

The substrate 101 may be made of a single, integral part manufactured by a molding or milling technique, in particular by injection molding. The substrate is applied with a structured metal layer (not illustrated) as described above. It is possible to manufacture the substrate 101 from more than one part. Then, each part can separately be provided with a metal structure in a way described above and the parts can be attached (e.g., soldered) together.

Figure 2:
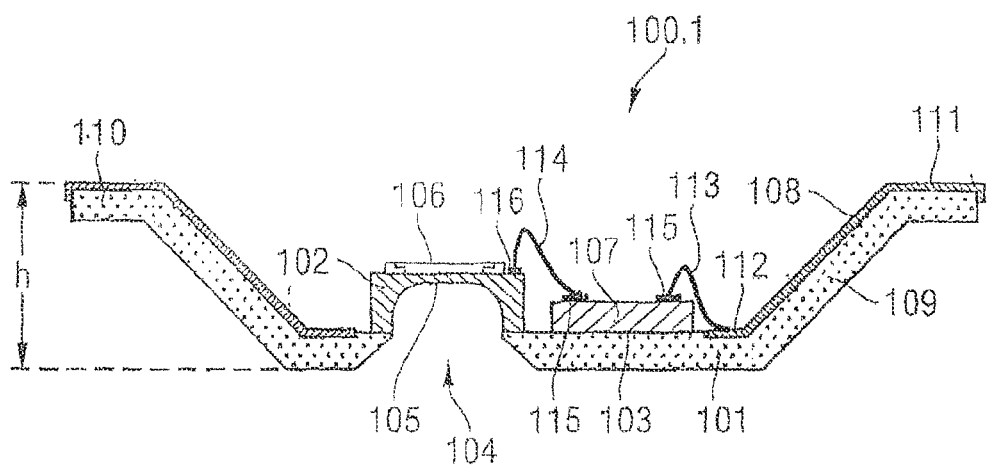
FIG. 2 illustrates a sectional side view of a module according to the first embodiment including an additional electronic component mounted side by side to a micro-electro-mechanical microphone.

In the following drawings same reference sings designate like or similar parts. FIG. 2 illustrates a module 100.1 which is more detailed compared with the module 100 of FIG. 1. The trough-shaped depression 103 of the substrate 101 of this module 100 carries two electronic elements. The first element is the micro-electro-mechanical microphone 102 which is mounted in a face-up position in the trough-shaped depression 103 of the substrate 101. It covers an opening in the substrate 101 which is an acoustic aperture 104. Sound can pass through this aperture 104 to reach the membrane 105 of the micro-electro-mechanical microphone 102. The aperture 104 can have a constant circular cross-section, it can be funnel-shaped or its cross-sectional shape can follow a special function, for instance an exponential function. The micro-electro-mechanical microphone 102 carries a counter electrode 106 which is driven at a voltage different to the voltage of the membrane 105.

The second element is an additional electronic component 107 which is also mounted in a face-up position next to the micro-electro-mechanical microphone 102 in the trough-shaped depression 103. The additional electronic component 107 can be an integrated circuit such as an application specific integrated circuit (ASIC) and may contain electronic components such as filters, comparators, amplifiers, time delayers, equalizers, logic elements or analog to digital converters. It may be designed in analog technique to only process analog signals or it may be designed in digital technique to transform analog signals of the micro-electro-mechanical microphone 102 to digital signals. In the case that the integrated circuit is designed in digital technique the frequency response of the micro-electro-mechanical microphone 102 can be equalized by implementing digital filters in the integrated circuit. In the case that analog technique is used, additional discrete non-active components (not illustrated) may be provided for signal shaping.

The substrate 101 may include at least one conducting element which could be connected to the micro-electro-mechanical microphone 102. The conducting element may be one or more of at least one electrical feed-through, a conduction path or a contact pad. Further, a metal layer which could be applied on the internal and/or the external side of the substrate 101 could be used to screen the micro-electro-mechanical microphone 102 or the additional electronic component 107. The module 100 may carry in the depression 103 conduction paths 108 which extend along the side wall 109 of the substrate 101 to the brim 110 of the trough-shaped depression 103 of the substrate 101 and may end there in contact pads 111. The conduction paths 108 may also pass around the outer edge of the brim 110. The conduction paths 108 may e.g., be structured by laser structuring or another structuring technique and may be reinforced as described above.

The trough-shaped depression 103 of the substrate 101 may also carry contact pads 112 which serve as contact elements between conduction paths 108, additional electronic components 107 or the micro-electro-mechanical microphone 102. The connection between contact pads 112 and the additional electronic component 107 or the micro-electro-mechanical microphone 102 may be made by wire bonding techniques. Wires 113 are drawn from contact pads 112 to pads 115 of the additional electronic component 107. Also wires 114 are drawn from pads 116 of the micro-electro-mechanical microphone 102 to pads 115 of the additional electronic component 107. Copper, gold or aluminum can be used as wire material. Wedge bonding or ball bonding techniques can be used to generate the connections of the wires 113, 114 with the pads 115, 116.

FIG. 2 illustrates only two electronic components in the trough-shaped depression 103 of the substrate 101, namely the micro-electro-mechanical microphone 102 and the additional electronic component 107. Depending on requirements, it is also possible to mount none or more than one additional electronic component 107 in the trough-shaped depression 103. More specifically, if merely the micro-electro-mechanical microphone 102 is mounted in the trough-shaped depression 103 of the substrate 101, the micro-electro-mechanical microphone 102 will be connected to contact pads 112 of the substrate 101. This could be done by bonding it via bond wires to the substrate 101 or it could be mounted in face-down position by soldering it to contact pads 112. These contact pads 112 are connected over conduction paths 108 with terminals (not illustrated) located outside the substrate 101 to couple a supply voltage to the micro-electro-mechanical microphone 102 and to couple the signals from the micro-electro-mechanical microphone 102 to electronic components (not illustrated) located outside the substrate 101.

FIG. 2 illustrates that arranging the micro-electro-mechanical microphone 102 side by side to the additional electronic component 107 leads to compact modules 100.1 of small height. The height of a micro-electro-mechanical microphone 102 may e.g., be about 0.4 mm, the height of the additional electronic component 107 which could be an integrated circuit, may e.g., be slightly smaller, the thickness of the depression 103 may be about 0.2 to 0.4 mm and the overall height h of a module 100 may therefore be less than 1 mm.

Figure 3:
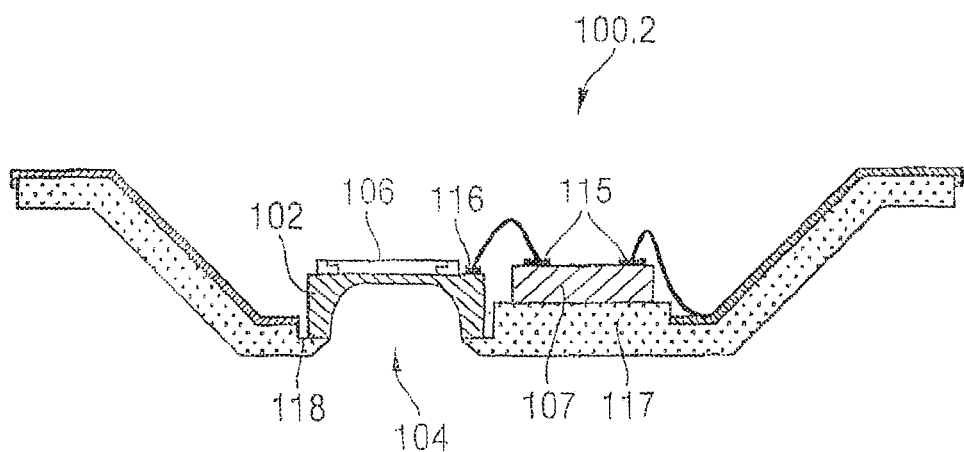
FIG. 3 illustrates a sectional side view of a module according to a first embodiment including a height compensation between an additional electronic component and a micro-electro-mechanical microphone.

In FIG. 3 a slightly modified module 100.2 of FIG. 2 is illustrated. The mounting of the additional electronic component 107 on a socket 117 and the mounting of the microelectro-mechanical microphone 102 in a recess 118 leads to a design having all pads 115 and 116 of the at least one additional electronic component 107 and the micro-electro-mechanical microphone 102 in one plane, which is advantageous in the wire bonding process.

Figure 4:
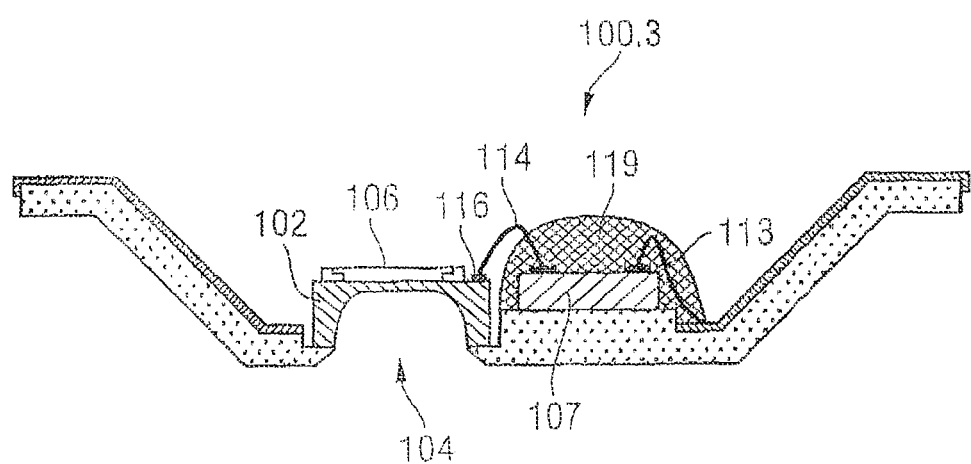
FIG. 4 illustrates a sectional side view of a module according to a first embodiment including a packaged additional electronic component.

In FIG. 4 the at least one additional electronic component 107 of module 100.3 is packaged using a mold compound 119. This leads to a protection against light irradiation or mechanical influences of the component 107 and the bond wires. The mold compound 119 may for example be made of a thermoplastic resin or a thermosetting plastic, for example epoxy resin. It typically encapsulates the at least one additional electronic component 107 and at least a part of the wires 113 and 114.

Figure 5:
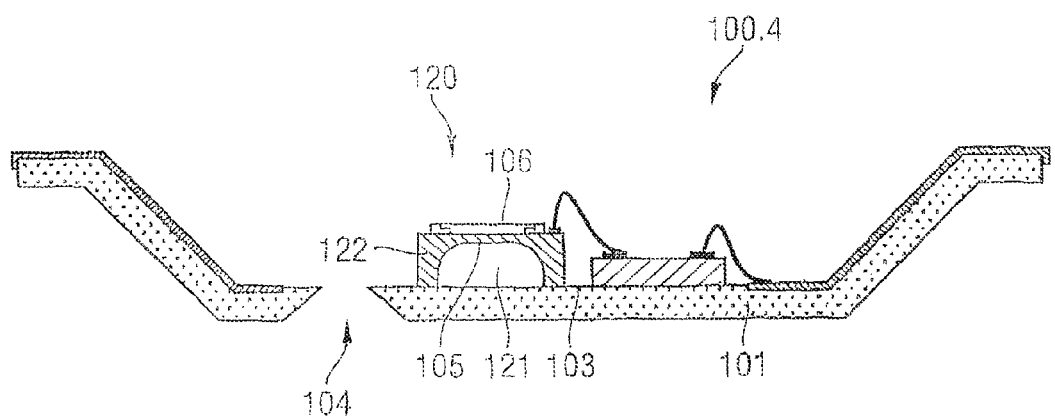
FIG. 5 illustrates a sectional side view of a module according to a first embodiment, wherein the micro-electro-mechanical microphone is mounted next to an acoustic aperture.

In FIG. 5, the micro-electro-mechanical microphone 102 is mounted adjacent to the acoustic aperture 104 in module 100.4. The sound can pass through the aperture 104 to drive the membrane 105 from the back side 120 of the micro-electro-mechanical microphone 102. Due to the powering of the micro-electro-mechanical microphone 102 from the back side 120 and due to its mounting in face-up position on the trough-shaped depression 103 of the substrate 101, a small closed back volume 121 is defined by the side wall 122 and the membrane 105 of the micro-electro-mechanical microphone 102. This configuration leads to a protection of the membrane 105 against particles.

Figure 6:
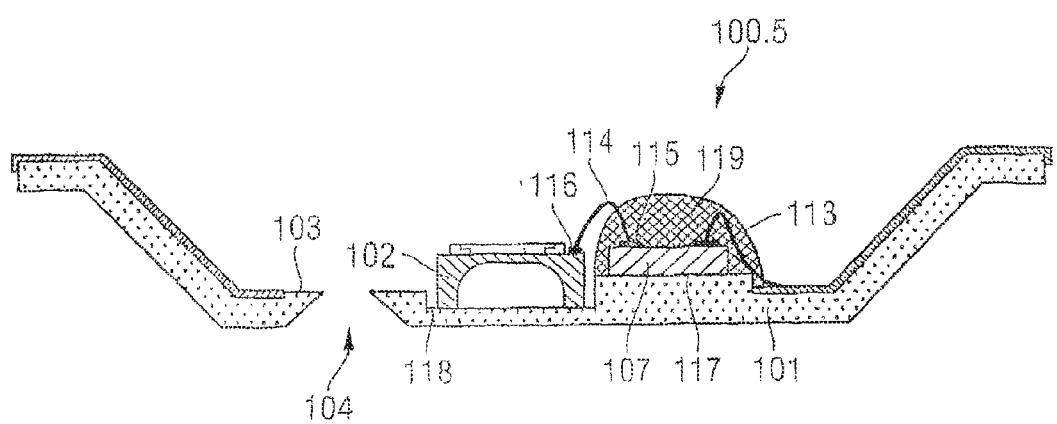
FIG. 6 illustrates a sectional side view of a module according to a first embodiment including a height compensation between an additional electronic component and a micro-electro-mechanical microphone wherein the micro-electro-mechanical microphone is mounted next to an acoustic aperture.

A slightly modified module 100.5 of module 100.4 (FIG. 5) is illustrated in FIG. 6, wherein the micro-electro-mechanical microphone 102 and the additional electronic component 107 are mounted in the trough-shaped depression 103 of the substrate 101 in a manner that their pads 115, 116 are positioned in one plane. To this end, the micro-electro-mechanical microphone 102 is mounted in a recess 118 and/or the additional electronic component 107 is mounted on a socket 117 of the substrate 101. In addition, the additional electronic component 107 is illustrated to be protected by a mold compound 119.

Figure 7:
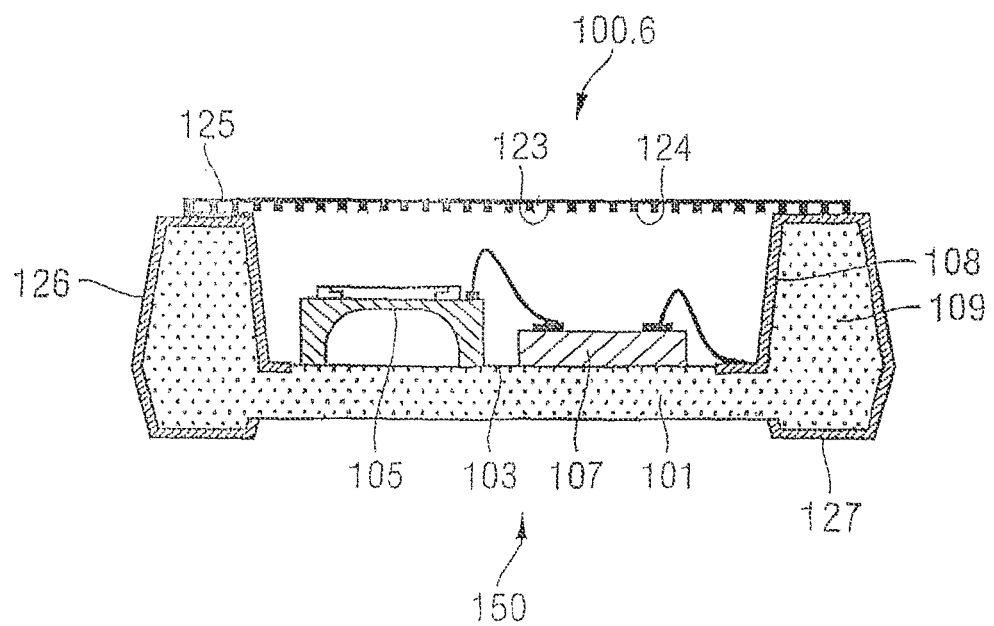
FIG. 7 illustrates a sectional side view of a module according to a first embodiment having a lid which closes the trough-shaped depression of the substrate.

Modules 100, 100.1-5 could further include a lid 123 which closes the trough-shaped depression 103 of the substrate 101 and forms a closed acoustic volume for the micro-electro-mechanical microphone 102. If the lid 123 is a foil 124 which can easily be excited by sound, it is possible to transmit sound to the membrane 105 of the micro-electro-mechanical microphone 102 without having an acoustic aperture 104, as illustrated in FIG. 7. Such modules as exemplified by module 100.6 are compact and air tight and therefore perfectly protected against the environment. The foil 124, which can have a thickness of several tens to several hundreds of micrometers, can be attached to the brim 110 of the trough-shaped depression 103 of the substrate 101 by a conductive adhesive. All common plastics as polypropylene, polyvinyl chloride, polyethylene, polyethylene terephthalate or the like can be used as foil 124 materials.

To screen the elements inside the trough-shaped depression 103 of the substrate 101 against electromagnetic radiation, the foil 124 and/or the substrate 101 may be at least partially conductive. Therefore the foil 124 and/or the substrate 101 could be at least partially coated with a metal layer 125, 126. The metal layers 125, 126 need not cover the whole surface of the foil 124 and/or the substrate 101 but they may be applied to appropriate locations on the foil 124 and/or substrate 101 to shield the elements to be protected in such a way that electromagnetic waves are sufficiently attenuated when entering into the trough-shaped depression 103 of the substrate 101. Therefore, it could be sufficient to coat the foil 124 and/or the substrate 101 with net-like or disc-like patterns of metal layers 125, 126. Preferably, the foil 124 should be coated at its external side. Then the metal layer 125 of the foil 124 is wrapped at some positions around the edge of the foil 124 to obtain an electrical contact to an conductive adhesive (not illustrated) and to a metal layer 126 extending on the substrate 101.

Such modules 100.6 may be mounted on a printed circuit board with their assembly side 150 at which the contact pads 127 are connected to contact pads of a mounting platform, e.g., a printed circuit board (not illustrated). For this purpose the signals of the micro-electro-mechanical microphone 102 and/or the additional electronic component 107 are transmitted via conduction paths 108 which pass around the side wall 109 of the trough-shaped depression 103 to the contact pads 127 located at the assembly side 150. At those positions where the foil 124 is in contact with the conduction paths 108, the metal layer 125 of the foil 124 is not wrapped around the foil's edge.

It is also possible to coat the internal side of the foil 124 with a metal layer (not illustrated in FIG. 7). In this case it should be prevented that the conduction paths 108 are bypassed by the metal layer 125 so that the metal layer may only have contact to one of the conduction paths 108. This can be for instance accomplished by using an non-conductive adhesive at positions where a contact should be avoided. Also a feed-through of conduction paths 108 a small distance under the surface of the brim 110 is possible to avoid contact of a foil metal layer with conduction paths 108.

Figure 8:
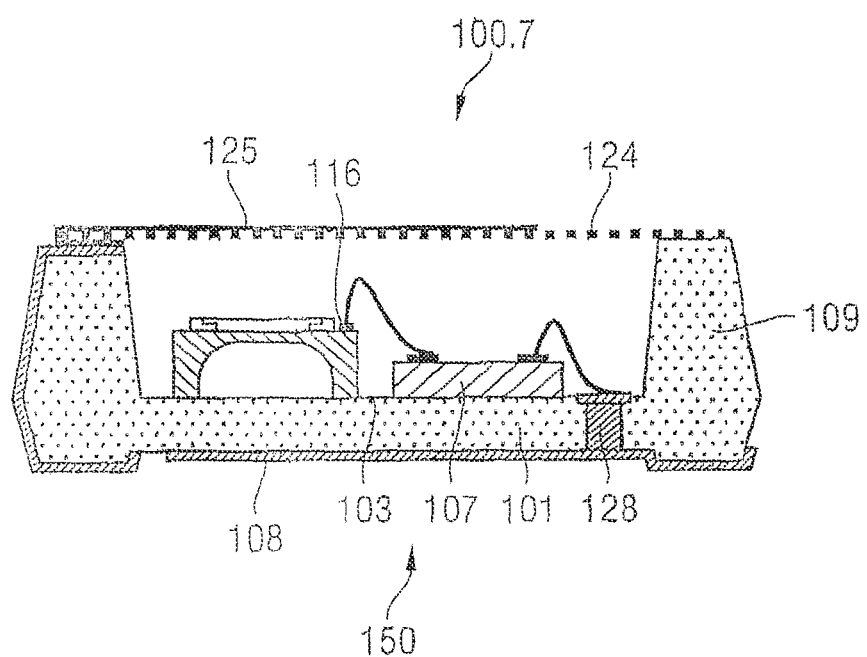
FIG. 8 illustrates a sectional side view of a module according to a first embodiment having an electrical feed-through through the trough-shaped depression of the substrate.

A further module 100.7 is illustrated in FIG. 8. The module 100.7 of FIG. 8 is similar to the module 100.6 of FIG. 7 but may not or only partially be equipped with conduction paths 108 which pass around a side wall 109 (FIG. 7). The module 100.7 is provided with at least one electrical feed-through 128 located in the depression 103 which couples the signal from the at least one additional electronic component 107 to the conduction path 108 of the assembly side 150 of the substrate 101. The feed-through 128 or additional feed-throughs may be used to couple to the pads 116 of the electro-mechanical microphone 102. Also a combination of electrical feed-throughs 128 and conduction paths 108 passing around the side wall 109 of the substrate 101 is possible to contact the terminals of the micro-electro-mechanical microphone 102 and the additional electronic component 107 to external applications.

As modules 100.6, 100.7 illustrated in FIGS. 7 and 8 both use a thin foil 123 to close the volume defined by the substrate 101 and the foil 123, both modules 100.6, 100.7 may have a very small height of less than 1.5 mm, more specifically 1.0 mm.

Figure 9:
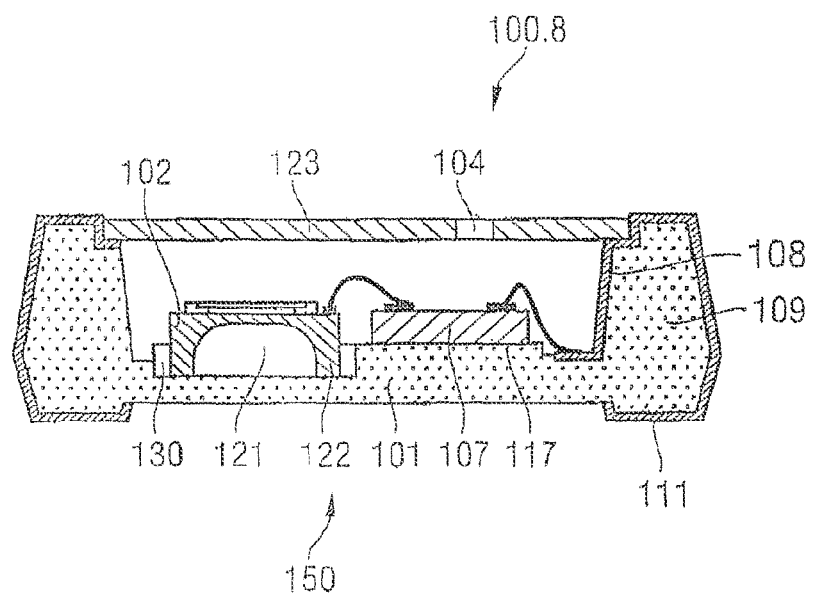
FIG. 9 illustrates a sectional side view of a module according to a first embodiment wherein an acoustic aperture is in a lid.

A module 100.8 similar to those of the FIGS. 7 and 8 which uses a solid lid instead of an elastic foil is illustrated in FIG. 9. The lid 123 may consist of a polymer which can be made of a molded polymer or of a thermosetting plastic. To shield the micro-electro-mechanical microphone 102 and/or the additional electronic component(s) 107, the lid 123 may be coated with a metal layer (not illustrated), it can be filled with metal particles or it can be made of a metal. The lid 123 includes an acoustic aperture 104 to let the sound pass through. The thickness of the lid 123 could be about 0.1 to 0.3 mm. To achieve a tight mounting of the micro-electro-mechanical microphone 102 on the trough-shaped depression 103 of the substrate 101, a sealing 130 may be used which may include an adhesive. The side walls 122 of the micro-electro-mechanical microphone 102 mounted like this form a small back volume 121. The module 100.8 is intended to be mounted with the assembly side 150 to a mounting platform, e.g., a printed circuit board (not illustrated) of a customer. The signals of the micro-electro-mechanical microphone 102 and/or the additional electronic component 107 are guided via conduction paths 108 around the side wall 109 to the contact pads 111 at the assembly side 150 of the substrate 101.

Figure 10:
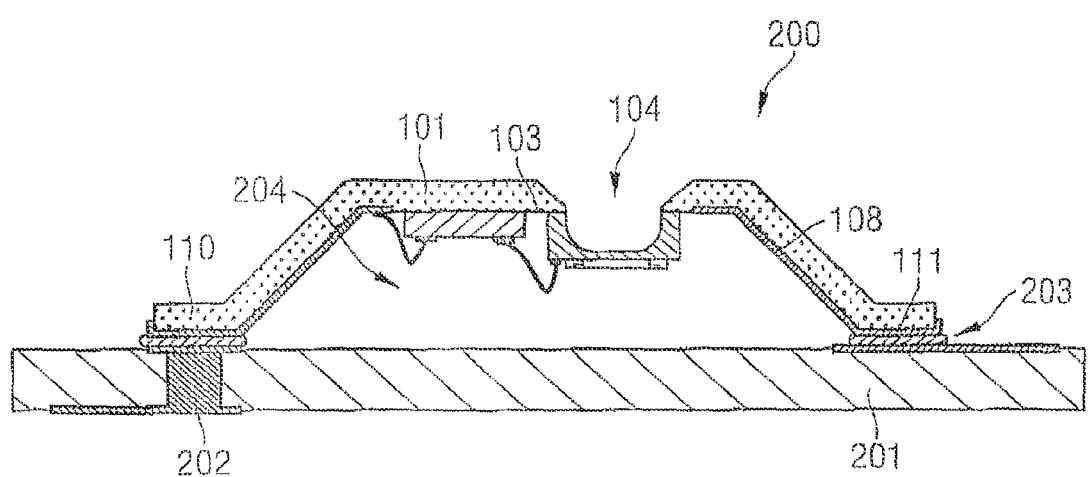
FIG. 10 illustrates a sectional side view of a assembly according to a second embodiment.
Figure 12:
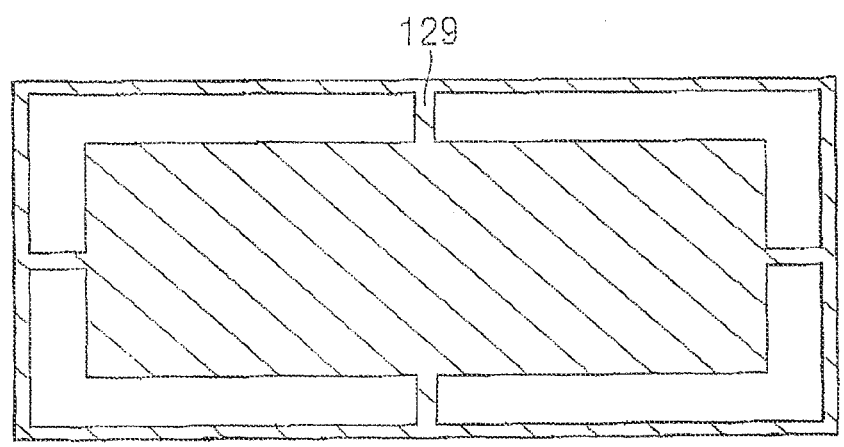
FIG. 12 illustrates a plan view of the design of contact pads on the brim of the substrate of the module.

FIG. 10 illustrates an assembly 200 in which a module 100, 100.1-5 as illustrated in FIGS. 1 to 6 is mounted on a mounting platform, e.g., a printed circuit board 201. The assembly 200 includes a substrate 101, a micro-electro-mechanical microphone 102 and the mounting platform 201. The substrate 101 has a trough-shaped depression 103 and carries in its depression 103 the micro-electro-mechanical microphone 102. The substrate 101 is disposed on the mounting platform 201 in a way that the trough-shaped depression 103 is closed by the mounting platform 201. The substrate 101 is provided with contact pads 111 which are located at the brim 110 of the trough-shaped depression 103 and which are soldered to contact pads of the mounting platform 201. With the exception of narrow gaps 129, (FIG. 12), the contact pads 111 may form an almost completely closed frame on the brim 110 of the trough-shaped depression 103. FIG. 12 illustrates a possible footprint of an arrangement of the contact pads 111 on the brim 110. Thus, an almost airtight design between a module 100, 100.1-5 and a mounting platform 201 is achieved by soldering the contact pads 111 to their counter pads on the mounting platform 201, i.e. by forming an airtight back volume 204 of the assembly 200. Typically, a small distance 203 between two contact pads is needed for soldering them together. The connection of the contact pads 111 to their counter pads on the mounting platform 201 can be obtained by conductive adhesives.

The distance 203 enlarges the openings above the gaps 129 between the substrate 101 and the mounting platform 201 and thus worsens the tightness of the back volume 204. Therefore, the tightness may be improved by a special design of the substrate 101 or the mounting platform 201 in which footlike sockets 205 (see FIG. 11) are applied on the mounting platform 201 or on the brim 110 of the substrate 101 to close the openings above the gaps 129. Such a design leads to an assembly 200 having a tight and large back volume 204 with a capacity of about 1 to 4 mm$^3$ or even larger. Such relative large back volumes 204 improve the performance of micro-electro-mechanical microphones 102 as they result in a frequency bandwidth which is extended to low frequencies compared to frequency bandwidths which can be reached with smaller back volumes below e.g., 1 mm$^3$.

Figure 11:
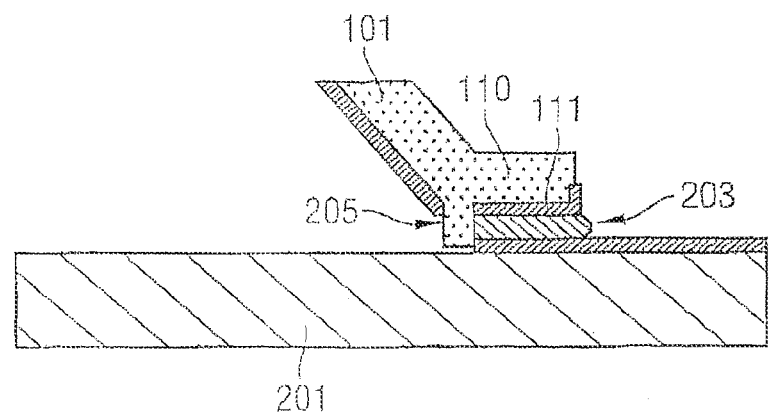
FIG. 11 illustrates a sectional side view of the mounting of a contact pad of a trough-shaped depression of the substrate with a contact pad on a printed circuit board.

It is to be noted that a module lid is omitted in the assemblies illustrated in FIGS. 10 to 12, where the open substrate 101 is directly mounted on the (e.g., customer's) mounting platform 201. Therefore, a very small overall height of the assembly (substrate 101 and mounting platform 201) may be achieved.

Figure 13:
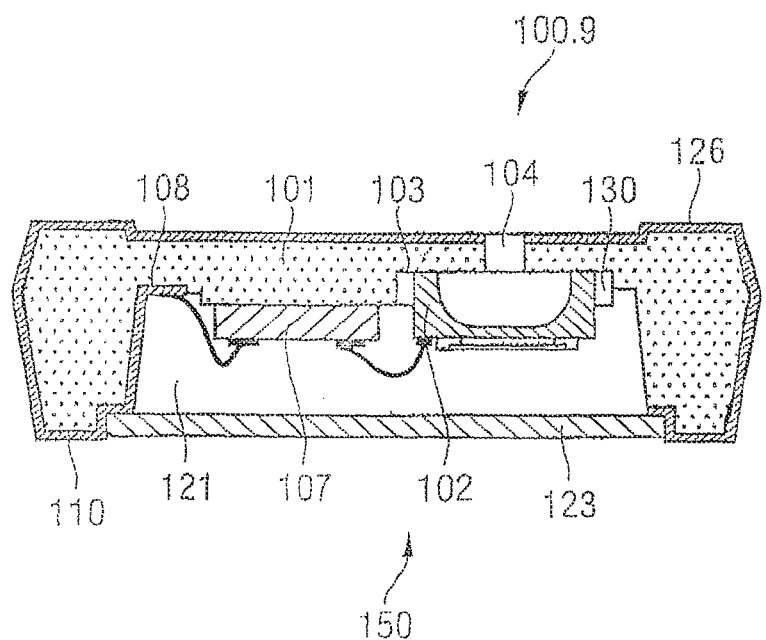
FIG. 13 illustrates a sectional side view of a module according to a first embodiment wherein an acoustic aperture is in the substrate.

FIG. 13 illustrates a module 100.9 which has similar features like the modules 100, 100.1-5 of FIGS. 1 to 6. The module 100.9 is closed at the trough-shaped depression 103 by a lid 123. Here, the module's assembly side 150 is turned towards the lid 123. The signals of the micro-electro-mechanical microphone 102 and/or the additional electronic component 107 are transmitted via conduction paths 108 to the brim 110 of the trough-shaped depression 103 of the substrate 101. The substrate 101 may at least partially be coated with a metal layer 126 that shields the module 100 against electromagnetic waves. This metal layer 126 can be connected to one of the conduction paths 108. Due to the mounting of the module 100.9 at its assembly side 150 to a mounting platform (e.g., printed circuit board, not illustrated), the lid 123 needs not to be conductive to screen electromagnetic waves. Rather, the mounting platform may be equipped with a shielding metal layer.

Figure 14:
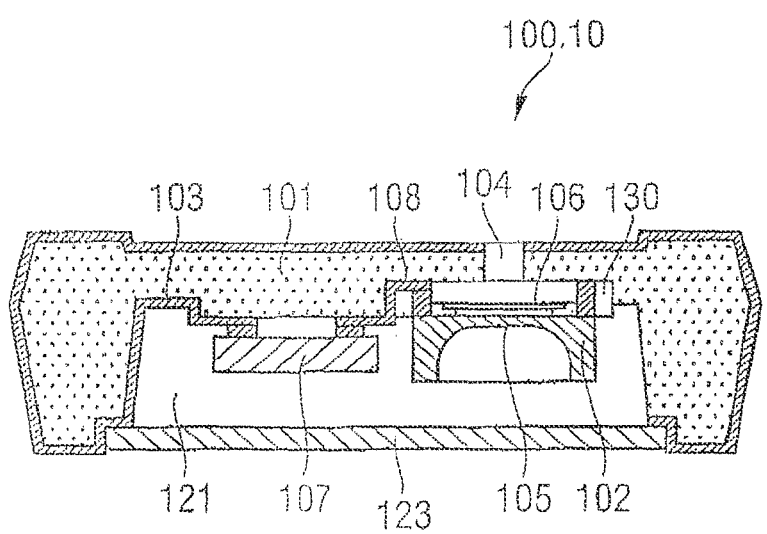
FIG. 14 illustrates a sectional side view of a module according to a first embodiment wherein a micro-electro-mechanical microphone is flip-chip mounted.

FIG. 14 illustrates a module 100.10 which illustrates the mounting of the micro-electro-mechanical microphone 102 and the additional electronic component 107 in face-down position on the trough-shaped depression 103 of the substrate 101. It is also possible to mount only one of them in a face-down position. Of course this type of mounting is also applicable to all modules 100, 100.1-8 illustrated in FIGS. 1 to 9. In the case that the micro-electro-mechanical microphone 102 and the at least one additional electronic component 107 are mounted in face-down position, the connections between the micro-electro-mechanical microphone 102 and the at least one additional electronic component 107 are made via conduction paths 108. If the at least one additional electronic component 107 is mounted in face-up position (not illustrated), bond wires from pads of the at least one additional electronic component 107 may be drawn to contact pads which are connected via conduction paths 108 to the micro-electro-mechanical microphone 102. In the case that the micro-electro-mechanical microphone 102 is face-down mounted, the sound passes through the acoustic aperture 104 to reach the counter electrode 106 first and then the membrane 105 of the micro-electro-mechanical microphone 102. The cavity adjoining counter electrode 106 is sealed against the back volume 121 by using e.g., an adhesive 130. A lid 123 that closes the depression 103 of the substrate 101 may be used to form an airtight back volume 121. It is to be noted that the use of this lid 123 is not stringently required since the module may be mounted directly on a mounting platform 201 by what a sealing of the depression 103 can also be reached.

Figure 15:
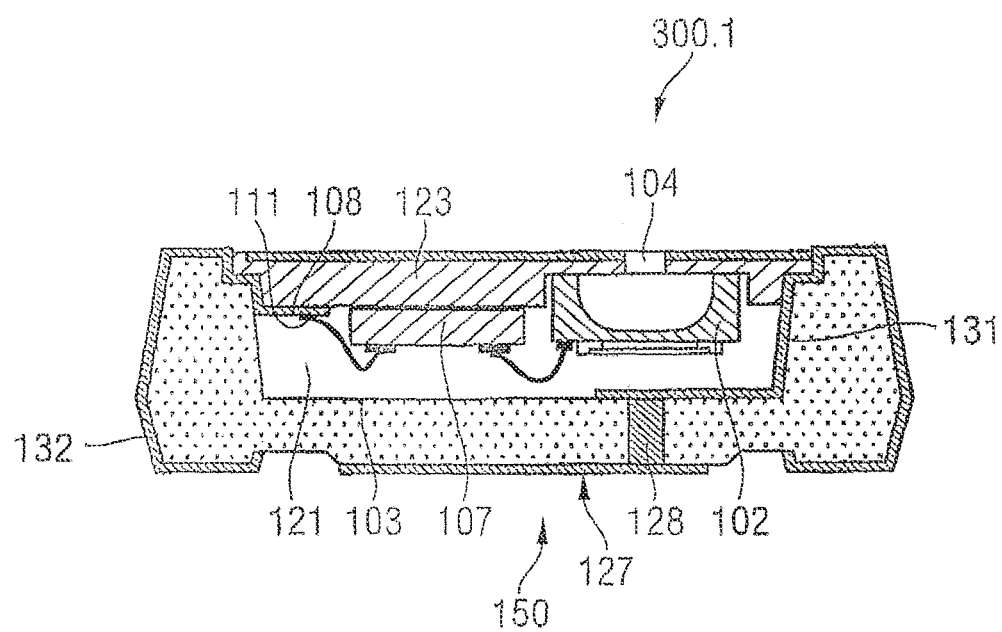
FIG. 15 illustrates a sectional side view of a module according to a third embodiment wherein a micro-electro-mechanical microphone is mounted on a lid.

FIG. 15 illustrates a module 300.1 of a further embodiment in which the micro-electro-mechanical microphone 102 and the at least one additional electronic component 107 are mounted on a lid 123. The lid 123 is made of a molded polymer or a thermosetting plastic and may itself be a MID (thus, the module 300 may be composed of two MIDs). The lid 123 may contain a metal layer 125, conduction paths 108, connection pads 111 and an acoustic aperture 104. The module 300 can be mounted at its assembly side 150 to a mounting platform 201, e.g., a printed circuit board. To couple the signals to connection pads on the assembly side 150, they can be guided via conduction paths 131 over the inner surface of the depression 103 and electrical feed-throughs 128 to the contact pads 127 on the assembly side 150 or they can be guided via conduction paths 132 over the outer surface of the substrate to the assembly side 150.

Figure 16:
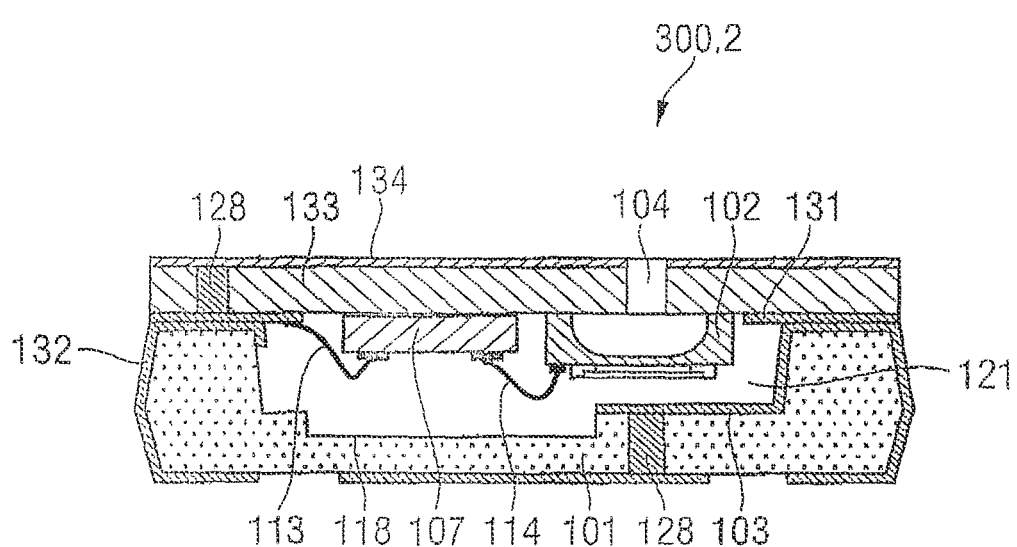
FIG. 16 illustrates a sectional side view of a module according to a third embodiment wherein a micro-electro-mechanical microphone is mounted on a substrate.

FIG. 16 illustrates a module 300.2 similar to module 300.1 of FIG. 15, wherein the plastic lid 123 of FIG. 15 is exchanged against a laminate structure 133 such as a piece of a printed circuit board or an SBU (Sequential Build-Up) laminate. The micro-electro-mechanical microphone 102 and the at least one additional electronic component 107 are mounted on the laminate structure 133. The laminate structure 133 may contain a metal layer 134 to shield the micro-electro-mechanical microphone 102 and/or the at least one additional electronic component 107. The micro-electro-mechanical microphone 102 and the at least one additional electronic component 107 are connected by bond wires 113, 114 to the laminate structure 133. The laminate structure 133 is connected by conduction paths 131 to the trough-shaped depression 103 of the substrate 101. The laminate structure 133 is provided with an electrical feed-through 128 to connect the metal layer 134 with conduction paths 132 of the substrate 101. In addition it has an acoustic aperture 104 to let the sound pass to the micro-electro-mechanical microphone 102. The height of such modules 300.1, 300.2 may be slightly greater than that of modules 100, 100.1-10 because of the thickness of the substrate of about 0.3 mm. To allow more space for the bond wires 113, 114 between the connection of the micro-electro-mechanical microphone 102 and the at least one additional electronic component 107 or between the at least one additional electronic component 107 and the laminate structure 133, the trough-shaped depression 103 of the substrate may be provided with a recess 118.

Figure 17:
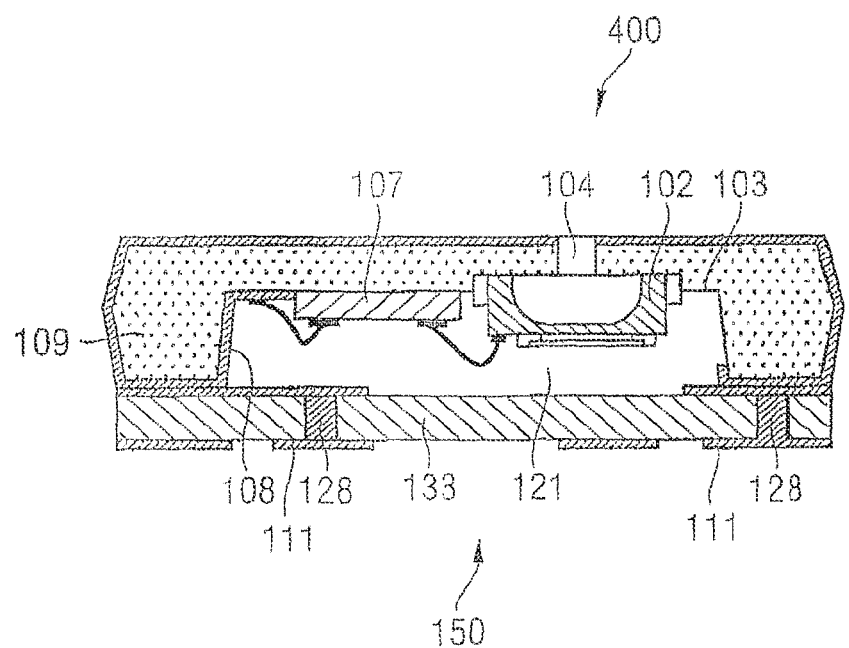
FIG. 17 illustrates a sectional side view of a module according to a fourth embodiment wherein a micro-electro-mechanical microphone is mounted in the trough-shaped depression of a substrate and the substrate is closed with a printed circuit board.

FIG. 17 illustrates a module 400 wherein the depression 103 of the substrate 101 is closed by a laminate structure 133. Thus, module 400 of FIG. 17 is similar to the module 100.9 of FIG. 13 except that the trough-shaped depression 103 of the substrate 101 is not closed by lid 123 (cf. FIG. 13) but by a laminate structure 133 such as a piece of a printed circuit board or an SBU (Sequential Build-Up) laminate. The outer surface of the laminate structure 133 is the assembly side 150 of the module 400. Similar to FIG. 16, the micro-electro-mechanical microphone 102 is mounted directly above an acoustic aperture 104 which, however, is provided in FIG. 17 in the substrate 101. The signals of micro-electro-mechanical microphone 102 and the at least one additional electronic component 107 are transmitted via conduction paths 108 running over the inner surface of the side walls 109 of the trough-shaped depression 103 to the inner metal layer of the laminate structure 133. The laminate structure 133 has electrical feed-throughs 128 to guide the signals to contact pads 111 of the outer surface of the piece of a printed circuit board 133. In case the laminate structure 133 is a printed circuit board, it may be a one-layer or a multi-layer printed circuit board.

It is to be noted that features of the modules and assemblies illustrated by way of example in FIGS. 1 to 17 may be combined to provide additional embodiments as far as such combinations are not excluded by physical constraints. Further, all modules described herein provide for a high design variability due to the usage of a molded "three-dimensional" substrate 101. All modules in which the micro-electro-mechanical microphone 102 is located above the acoustic aperture 104 provide for a large acoustic back volume (i.e. the volume behind the membrane 105 as seen from the acoustic aperture 104).

This acoustic back volume 121, 204 is generated by mounting the substrate 101 of FIG. 1, 2, 3, 4 or 10 at its brim to a printed circuit board or any other tightening mounting platform or by closing the substrate 101 with a lid or a laminate structure as illustrated in FIGS. 9 and 13 to 17. In these cases the membrane 105 of the micro-electro-mechanical microphone 102 works against an airtight volume (that is the acoustic back volume 121, 204) which influences over its compliance Cv the acoustical performance of the transmission properties of the microphone in a way that adjusted back volumes lead to an optimized lower critical frequency. The most important characteristics which describe the behavior of the oscillating system are the compliance Cm, i. e. deflection per pressure change of the membrane 105, the area A of the membrane 105 and the compliance Cv of the acoustic back volume 121, 204. The relationship between these characteristics is $$Cm \cdot A \sim Cv.$$

The compliance Cv of the back volume 121, 204 depends linearly upon the size of the acoustic back volume V and inversely proportional upon the density of air and the squared velocity of sound. Therefore the above given proportional relationship can be modified to characterize the dependency between size V of the acoustic back volume 121, 204 and the area A of the membrane 105 by $$Cm \cdot A \sim V.$$

To obtain a frequency dynamic performance with a low transmittable critical frequency, the ratio between the back volume V and the area A of the membrane may be chosen to be larger than 2 mm at least in a case of a back volume larger than 2 $mm^3$.

For all modules described herein, small heights are feasible. High efficiency manufacturing processes are especially obtained in cases where the micro-electro-mechanical microphone 102 and/or the additional component 107 are mounted face-down, i.e. by a flip-chip mounting process.

It is further to be understood that all modules illustrated in FIGS. 1 to 17 may be manufactured in similar processes. Two exemplary processes are illustrated in FIG. 18 and FIG. 19 by using flow charts.

Figure 18:
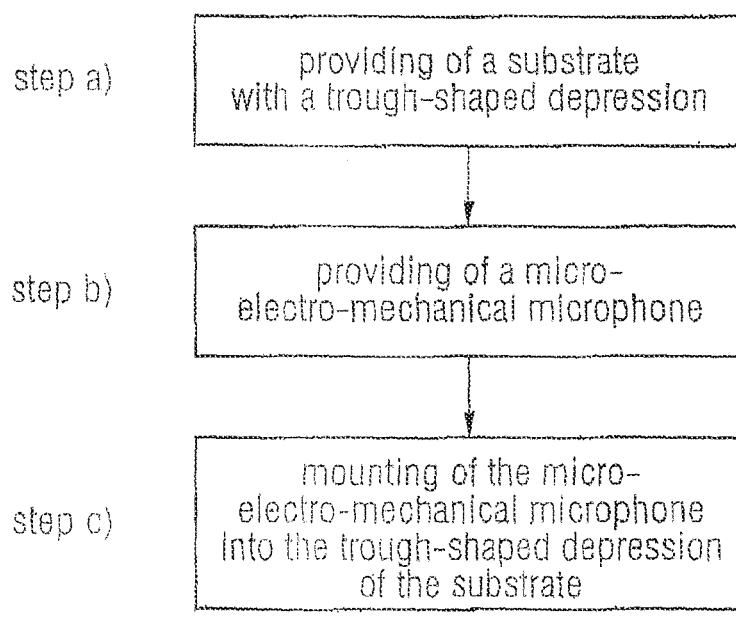
FIG. 18 illustrates a flow chart of a method to manufacture a module.

According to FIG. 18 a first method for producing a module 100 includes the process a) of providing a substrate 101 with a trough-shaped depression 103, the process b) of providing a micro-electro-mechanical microphone 102 and process c) of mounting the micro-electro-mechanical microphone 102 into the trough-shaped depression 103 of the substrate 101.

According to the different embodiments further processes could be necessary. For instance, electrically connecting the micro-electro-mechanical microphone 102 to at least one conducting element of the substrate 101 could be necessary. It could also be necessary to electrically connect the micro-electro-mechanical microphone 102 to at least one additional electronic component 107 and to electrically connect the at least one additional electronic component 107 with contact pads. Such conducting elements and the at least one additional electronic component are illustrated in FIGS. 1 to 9. Further, the closing of the trough-shaped depression 103 of the substrate 101 by a lid 123 could be necessary. Therefore, the lid 123 can be designed according to any of the described embodiments illustrated in FIGS. 7 to 9 and 13 to 17 and then attached to the substrate 101. Furthermore, the substrate 101 can be closed by disposing it on a carrier such as circuit board 201 as illustrated in FIG. 10.

Figure 19:
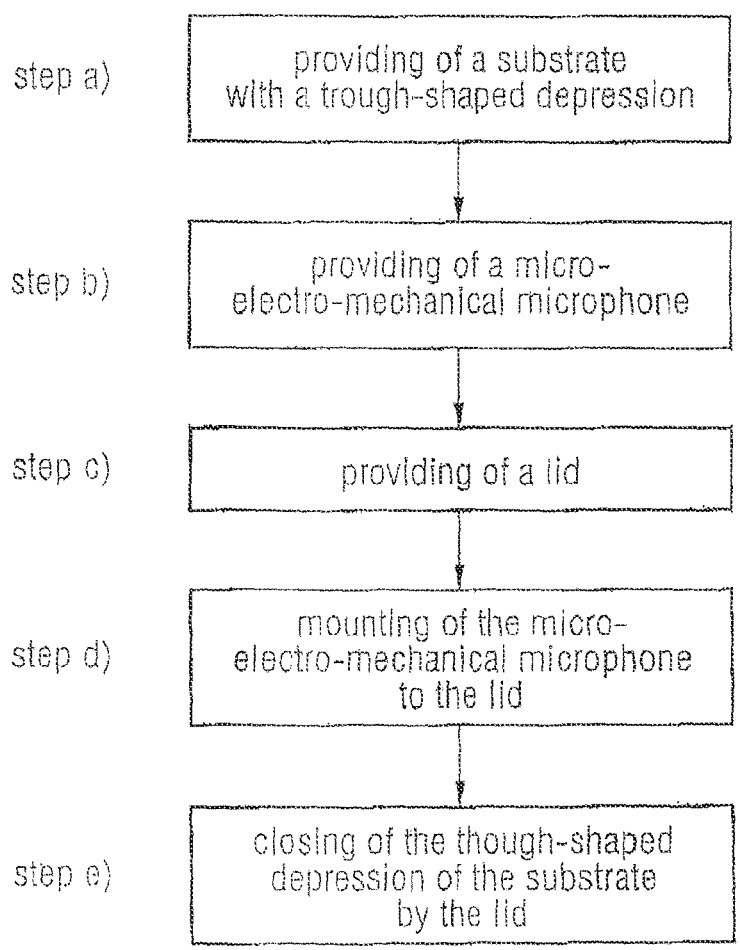
FIG. 19 illustrates a flow chart of another method to manufacture a module.

According to FIG. 19 a second method for producing a module 300 includes the process a) of providing a substrate 101 with a trough-shaped depression 103, the process b) of providing a micro-electro-mechanical microphone 102, the process c) of providing of a lid 123, the process d) of mounting the micro-electro-mechanical microphone 102 to the lid 123 and the process e) of closing the trough-shaped depression 103 of the substrate 101 by the lid 123.

The method may further include electrically connecting the micro-electro-mechanical microphone 102 to at least one conducting element of the lid 123 and the method may include electrically connecting the at least one conducting element of the lid 123 to at least one conducting element of the substrate 101. The lid can be designed according to any of the described embodiments illustrated in FIGS. 15 and 16.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A module comprising:
    a non-planar substrate having a trough-shaped depression, side walls extending from the depression, a brim extending from the side walls in a direction away from the trough-shaped depression at an angle with respect to the side walls, and an acoustic aperture extending through the trough-shaped depression of the substrate; and a micro-electro-mechanical microphone which is mounted into the trough-shaped depression of the substrate, wherein the micro-electro-mechanical microphone includes a membrane on a front side and a counter electrode on a back side, and wherein the front side is oriented toward substrate of the trough-shaped depression, and wherein the back side of the micro-electro-mechanical microphone is electrically connected to a conduction path within the trough-shaped depression.

2. The module of claim 1, wherein the substrate is a single, integral part.

3. The module of claim 1, wherein the substrate is a plastic part made by molding.

4. The module of claim 1, further comprising a lid configured to substantially close the trough-shaped depression of the substrate and forms a closed acoustic volume for the micro-electro-mechanical microphone.

5. The module of claim 4, wherein the lid is a foil.

6. The module of claim 5, wherein the foil is made to be at least partially conductive.

7. The module of claim 4, wherein the lid is made of a molded polymer which is at least partially coated by a metal layer.

8. The module of claim 4, wherein the lid is made of a molded polymer which is filled with metal particles.

9. The module of claim 1, wherein the conduction path comprises an electrical feed-through and a contact pad.

10. The module of claim 1, wherein the micro-electro-mechanical microphone is bonded via bond wires to the conduction path.

11. The module of claim 1, further comprising at least one additional electronic component comprising an ASIC.

12. The module of claim 11, wherein the additional electronic component and the micro-electro-mechanical microphone are mounted side by side.

13. The module of claim 1, wherein the overall height of the module is less than 1.0 mm.

14. The module of claim 1, wherein the size of an acoustic back volume of the module is larger than 4 mm3.

15. The module of claim 1, wherein the ratio between the acoustic back volume V and the area A of the membrane is larger than 2 mm.

16. An assembly comprising:
a non-planar substrate having a trough-shaped depression, side walls extending from the depression, and a brim extending from the side walls in a direction away from the trough-shaped depression at an angle with respect to the side walls;
a micro-electro-mechanical microphone which is mounted to the trough-shaped depression of the substrate; and
a printed circuit board on which the substrate is disposed such that the trough-shaped depression is closed by the printed circuit board to form a closed acoustic volume for the micro-electro-mechanical microphone.

17. The assembly of claim 16, wherein the substrate is a single, integral part.

18. The assembly of claim 16, wherein the substrate is a plastic part made by molding.

19. A module comprising:
a non-planar substrate having a trough-shaped depression and side walls terminating in a brim extending in a direction away from the trough-shaped depression, the substrate comprising plastic;
a lid configured to close the trough-shaped depression; and a micro-electro-mechanical microphone mounted on the lid with a front side facing the lid and a back side electrically connected to the lid.

20. The module of claim 19, wherein the lid is made of a molded polymer.

21. The module of claim 19, wherein the lid is at least partially coated by a metal layer.

22. The module of claim 19, wherein the lid is filled with metal particles.

23. The module of claim 19, wherein the lid is made of a laminate structure.

24. The module of claim 19, wherein the lid comprises a conducting element which is connected to the micro-electro-mechanical microphone.

25. The module of claim 24, wherein the conducting element is selected from at least one of an electrical feed-through, a conduction path and a contact pad.

26. The module of claim 16, wherein the substrate has an acoustic aperture.

27. The module of claim 19, wherein the substrate is at least partially coated by a metal layer.

28. The module of claim 19, wherein an outside surface of the substrate forms an assembly side of the module.

29. The module of claim 19, wherein the micro-electro-mechanical microphone is bonded via bond wires to the lid.

30. The module of claim 19, wherein the micro-electro-mechanical microphone is flip-chip mounted to the lid.

31. A method for producing a module, comprising:
providing a non-planar substrate having a trough-shaped depression, side walls extending from the depression, and a brim extending from the side walls in a direction away from the trough-shaped depression at an angle with respect to the side walls;
providing a micro-electro-mechanical microphone having a membrane on a front side and a counter electrode on a back side;
mounting the micro-electro-mechanical microphone to the trough-shaped depression of the substrate with the front side facing the substrate;
powering the micro-electro-mechanical microphone from a back side; and
closing the trough-shaped depression of the substrate by a planar lid.

32. The method of claim 31, wherein powering the micro-electro-mechanical microphone comprises:
electrically connecting the micro-electro-mechanical microphone to at least one conducting element of the substrate.

33. A method for producing a module, comprising:
providing a non-planar substrate having a trough-shaped depression, side walls extending from the depression, and a brim extending from the side walls in a direction away from the trough-shaped depression at an angle with respect to the side walls, the substrate comprising plastic;
providing a micro-electro-mechanical microphone having a membrane on a front side and a counter electrode on a back side;
providing a lid;
mounting the micro-electro-mechanical microphone to the lid;
electrically connecting the back side of the micro-electro-mechanical microphone to at least one conducting element of the lid; and
closing the trough-shaped depression of the substrate with the lid.

34. The method of claim 33, further comprising:
electrically connecting the at least one conducting element of the lid to at least one conducting element of the substrate.

35. The module of claim 1, wherein the micro-electro-mechanical microphone is mounted over the acoustic aperture of the substrate.

36. The module of claim 1, at least one additional electronic component having contact pads, wherein the contact pads of the at least one additional electronic component and contact pads of the micro-electro-mechanical microphone are planar.

37. The method of claim 31, further comprising:
providing an acoustic aperture in the trough-shaped depression, wherein the front side of the micro-electro-mechanical microphone is mounted over the acoustic aperture.

38. The method of claim 32, wherein electrically connecting the micro-electro-mechanical microphone to the at least one conducting element of the substrate includes wire bonding.

39. The method of claim 31, further comprising:
providing an acoustic aperture in the lid.

\* \* \* \* \*